United States Patent
Kim et al.

(10) Patent No.: US 9,839,115 B2
(45) Date of Patent: Dec. 5, 2017

(54) TOUCH WINDOW AND MANUFACTURING METHOD THEREOF

(71) Applicant: LG INNOTEK CO., LTD., Seoul (KR)

(72) Inventors: Byung Soo Kim, Seoul (KR); Jong Il Kim, Seoul (KR); Ji Won Jo, Seoul (KR); Hyuk Jin Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 169 days.

(21) Appl. No.: 13/894,539

(22) Filed: May 15, 2013

(65) Prior Publication Data

US 2013/0308316 A1    Nov. 21, 2013

(30) Foreign Application Priority Data

May 15, 2012  (KR) .......................... 10-2012-0051332

(51) Int. Cl.
| | | |
|---|---|---|
| *G01D 11/28* | (2006.01) | |
| *H05K 1/02* | (2006.01) | |
| *G06F 3/041* | (2006.01) | |
| *G06F 3/0354* | (2013.01) | |

(52) U.S. Cl.
CPC .............. *H05K 1/02* (2013.01); *G01D 11/28* (2013.01); *G06F 3/03547* (2013.01); *G06F 3/041* (2013.01); *B32B 2451/00* (2013.01); *Y10T 428/24628* (2015.01);
(Continued)

(58) Field of Classification Search
CPC ........ G06F 3/041; G06F 3/0414; G06F 3/042; G06F 3/04817; G06F 3/03547; G01D 11/28; H05K 1/02; Y10T 428/24736; Y10T 428/24628; Y10T 428/24851; Y10T 428/24876; Y10T 428/24868; B32B 2307/422; B32B 2307/414; B32B 2307/402; B32B 2307/412; B32B 2451/00; B32B 27/20
USPC ........... 362/23.01, 23.02, 23.07, 23.1, 23.12, 362/23.13, 23.19, 23.05, 253; 345/173, 345/176, 174; 428/166, 195.1, 206, 207, 428/187, 204; 340/407.1, 407.2, 815.45, 340/815.48, 815.5, 815.53, 815.54,
(Continued)

(56) References Cited

U.S. PATENT DOCUMENTS

| | | | | |
|---|---|---|---|---|
| 3,940,523 A | * | 2/1976 | Lecoeur ................. | B44F 1/066 156/100 |
| 4,933,218 A | * | 6/1990 | Longobardi ............ | B41M 1/34 101/487 |
| 5,178,928 A | * | 1/1993 | Goto et al. .................... | 428/106 |

(Continued)

FOREIGN PATENT DOCUMENTS

WO    WO 2011040291 A1 *    4/2011

OTHER PUBLICATIONS

Endo et al, Mounting structure for touch input device equipped with a pressure sensor, Apr. 7, 2011, english translation.*

*Primary Examiner* — Bryon T Gyllstrom
*Assistant Examiner* — James Endo
(74) *Attorney, Agent, or Firm* — Saliwanchik, Lloyd & Eisenschenk

(57) ABSTRACT

Disclosed is a touch window. The touch window includes a cover window; a first print layer disposed on the cover window to form an instruction icon pattern part; a second print layer in the instruction icon pattern part; and a reinforcement material on the second print layer.

5 Claims, 5 Drawing Sheets

(52) U.S. Cl.
CPC .................. *Y10T 428/24736* (2015.01); *Y10T 428/24851* (2015.01); *Y10T 428/24868* (2015.01)

(58) Field of Classification Search
USPC ............ 340/815.55, 815.56, 815.57, 815.65, 340/815.73
See application file for complete search history.

(56) References Cited

U.S. PATENT DOCUMENTS

| | | | | |
|---|---|---|---|---|
| 5,223,357 | A * | 6/1993 | Lovison | G02B 5/32 156/244.22 |
| 5,232,764 | A * | 8/1993 | Oshima | 428/195.1 |
| 5,234,744 | A * | 8/1993 | Kenmochi | B41J 5/12 200/310 |
| 5,440,080 | A * | 8/1995 | Nagaoka et al. | 178/19.01 |
| 5,665,457 | A * | 9/1997 | Sato et al. | 428/195.1 |
| 5,736,233 | A * | 4/1998 | Fye | 428/204 |
| 5,853,854 | A * | 12/1998 | Nakanishi et al. | 428/172 |
| RE37,186 | E * | 5/2001 | Hill | B32B 17/10247 156/240 |
| 6,326,074 | B1 * | 12/2001 | Takahashi | 428/156 |
| 6,416,844 | B1 * | 7/2002 | Robson | 428/142 |
| 6,551,694 | B1 * | 4/2003 | Imamichi et al. | 428/195.1 |
| 6,817,123 | B2 * | 11/2004 | Okazaki et al. | 40/452 |
| 6,993,830 | B2 * | 2/2006 | Shimizu et al. | 29/622 |
| 7,465,889 | B2 * | 12/2008 | Nakajima et al. | 200/5 A |
| 7,763,832 | B2 * | 7/2010 | Striegler et al. | 219/448.11 |
| 7,891,828 | B2 * | 2/2011 | Nakamura | 362/23 |
| 8,080,306 | B2 * | 12/2011 | Fukuma et al. | 428/195.1 |
| 8,242,396 | B2 * | 8/2012 | Chen et al. | 200/310 |
| 8,360,595 | B2 * | 1/2013 | Chang | 362/109 |
| 8,519,967 | B2 * | 8/2013 | Chien et al. | 345/173 |
| 8,591,050 | B2 * | 11/2013 | Yim | 362/23.19 |
| 8,698,754 | B2 * | 4/2014 | Rhyu et al. | 345/170 |
| 2002/0033380 | A1 * | 3/2002 | Kim | B44C 1/1712 216/37 |
| 2003/0001992 | A1 * | 1/2003 | Kawase et al. | 349/106 |
| 2003/0122794 | A1 * | 7/2003 | Caldwell | A47B 57/00 345/173 |
| 2005/0274597 | A1 * | 12/2005 | Lee et al. | 200/600 |
| 2006/0267960 | A1 * | 11/2006 | Liao et al. | 345/173 |
| 2007/0148417 | A1 * | 6/2007 | Iwano | H01H 13/83 428/195.1 |
| 2008/0218371 | A1 * | 9/2008 | Joo | 340/815.65 |
| 2008/0266272 | A1 * | 10/2008 | Narayan et al. | 345/174 |
| 2009/0022957 | A1 * | 1/2009 | Aso | B29C 45/14688 428/160 |
| 2009/0022964 | A1 * | 1/2009 | Suzuki | B32B 27/00 428/203 |
| 2009/0096759 | A1 * | 4/2009 | Nishiwaki et al. | 345/173 |
| 2009/0236151 | A1 * | 9/2009 | Yeh et al. | 178/18.03 |
| 2009/0257010 | A1 * | 10/2009 | Sakurai | 349/110 |
| 2009/0284487 | A1 * | 11/2009 | Nakanishi et al. | 345/173 |
| 2009/0303195 | A1 * | 12/2009 | Yamato et al. | 345/173 |
| 2010/0028610 | A1 * | 2/2010 | Fujii | B32B 37/02 428/164 |
| 2010/0037638 | A1 * | 2/2010 | Ok | 62/125 |
| 2010/0097346 | A1 * | 4/2010 | Sleeman | 345/174 |
| 2010/0164870 | A1 * | 7/2010 | Kunthady et al. | 345/168 |
| 2010/0164881 | A1 * | 7/2010 | Kuo et al. | 345/173 |
| 2010/0188360 | A1 * | 7/2010 | Joung et al. | 345/174 |
| 2010/0219176 | A1 * | 9/2010 | Striegler | C03C 17/02 219/443.1 |
| 2010/0225606 | A1 * | 9/2010 | Sasaki et al. | 345/173 |
| 2011/0102370 | A1 * | 5/2011 | Kono et al. | 345/174 |
| 2011/0109590 | A1 * | 5/2011 | Park | 345/174 |
| 2011/0128114 | A1 * | 6/2011 | Kimura et al. | 338/13 |
| 2011/0227842 | A1 * | 9/2011 | Lin et al. | 345/173 |
| 2011/0234520 | A1 * | 9/2011 | Chan | 345/173 |
| 2011/0242465 | A1 * | 10/2011 | Lee et al. | 349/110 |
| 2011/0255260 | A1 * | 10/2011 | Weber et al. | 361/807 |
| 2011/0267288 | A1 * | 11/2011 | Jeon et al. | 345/173 |
| 2011/0318545 | A1 * | 12/2011 | Goto et al. | 428/195.1 |
| 2012/0064310 | A1 * | 3/2012 | Kawai et al. | 428/195.1 |
| 2012/0090902 | A1 * | 4/2012 | Liu et al. | 178/18.03 |
| 2012/0099292 | A1 * | 4/2012 | Yim | 362/97.1 |
| 2012/0217147 | A1 * | 8/2012 | Porter et al. | 200/600 |
| 2012/0286312 | A1 * | 11/2012 | Hatano et al. | 257/98 |
| 2013/0161178 | A1 * | 6/2013 | Kim et al. | 200/600 |

\* cited by examiner

TOUCH WINDOW AND MANUFACTURING METHOD THEREOF

CROSS-REFERENCE TO RELATED APPLICATION

This application claims the benefit under 35 U.S.C. §119 of Korean Patent Application No. 10-2012-0051332, filed May, 15, 2012, which is hereby incorporated by reference in its entirety.

BACKGROUND

A touch window is installed on a display surface of an image display device such as a cathode ray tube (CRT), a liquid crystal display (LCD), a field emission display (FED), a plasma display panel (PDP), and an electro-luminescence device (ELD), so that a user inputs predetermined information into an electronic appliance by pressing the touch panel while viewing the image display device.

FIG. 1 is a view showing a touch window.

Referring to FIG. 1, the touch window includes a cover window 10 which receives a touch input from an outside, a TSP (Touch Screen Panel) including a V/A (View Area) which receives the touch input through a sensing electrode and a D/A (Dead Area) which does not receive the touch input, and an instruction icon pattern part which is electrically connected to the TSP and is formed in an F/A (Function Area) of the cover window 10 as a button (instruction icon). A print part 20 may be coated on the D/A and the F/A and the instruction icon pattern part may be formed on the print part 20. The instruction icon pattern part may include a search key, a back key, a home key and a menu key sequentially installed from the left.

A blinking function for feedbacking a touch by a user using a light source such as an LED is applied to the F/A. However, a height difference area is formed between an area where the button part is formed and an area where the button part is not formed. Due to the height difference, the sensing electrode formed on the instruction icon pattern part may be subject to disconnection and crack. Thus, a problem may be caused in driving the instruction icon pattern part, and a quality of the touch window may be degraded.

BRIEF SUMMARY

The embodiment provides a touch window which includes a cover window; a first print layer disposed on the cover window to form an instruction icon pattern part; a second print layer in the instruction icon pattern part; and a reinforcement material on the second print layer.

Further, the embodiment provides a touch window which includes a cover window; a first print layer on the cover window and in which an instruction icon pattern part is formed; a second print layer in the instruction icon pattern part; and a reinforcement layer on the first print layer.

According to the embodiment, the height difference area formed between the instruction icon pattern part and the sensing electrode is filled with the reinforcement material or reinforcement layer, so that the sensing electrode can be inhibited from being subject to disconnection or fine crack which is caused in the instruction icon pattern part due to the thickness difference between the print layers.

Further, according to the embodiment, the reinforcement material or reinforcement layer is formed on the print part such that the inner area of the instruction icon pattern part can be filled with the reinforcement material or reinforcement layer, so that the instruction icon pattern part may be planarized, thereby improving the print quality.

DETAILED DESCRIPTION

Figure 1:
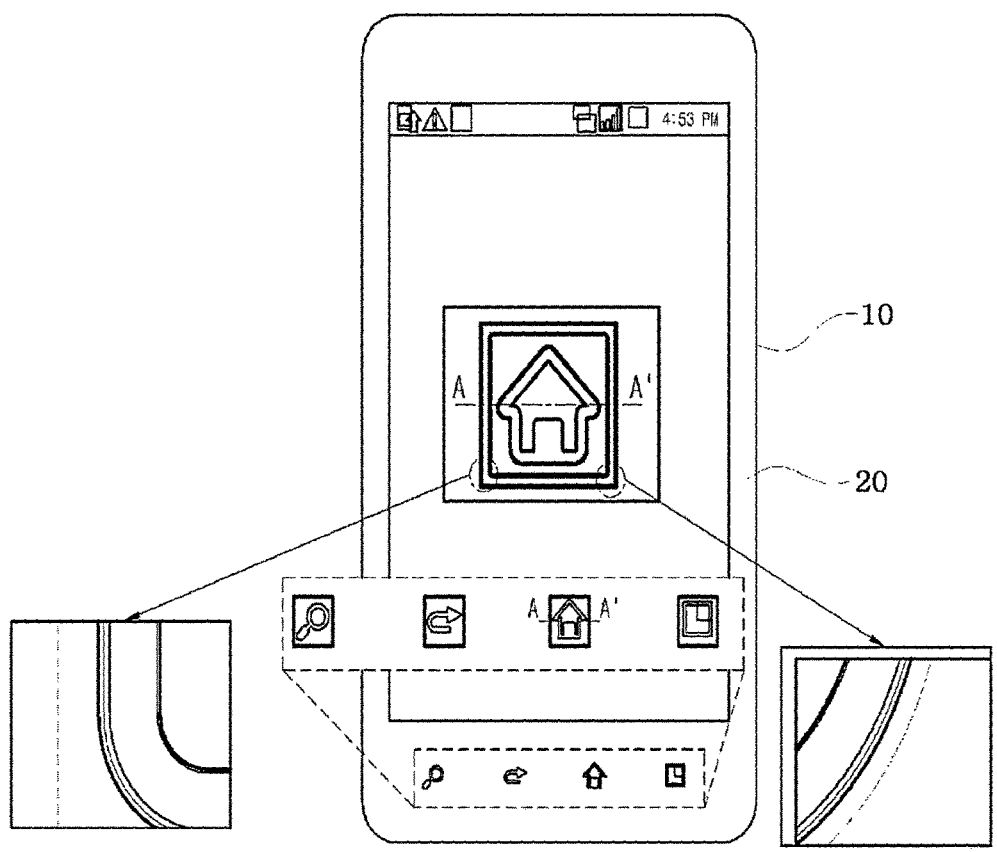
FIG. 1 is a view showing a touch window including an instruction icon.

Hereinafter, the structure and the operation according to the embodiment will be described in detail with reference to accompanying drawings. In the following description based on the accompanying drawings, the same elements will be assigned with the same reference numerals regardless of drawing numbers, and the repetition in the description of the same elements having the same reference numerals will be omitted in order to avoid redundancy. Although the terms "first" and "second" may be used in the description of various elements, the embodiment is not limited thereto. The terms "first" and "second" are used to distinguish one element from the other elements.

Hereinafter, a touch window according to an embodiment will be described in detail with reference to FIGS. 2 to 4.

Figure 2:
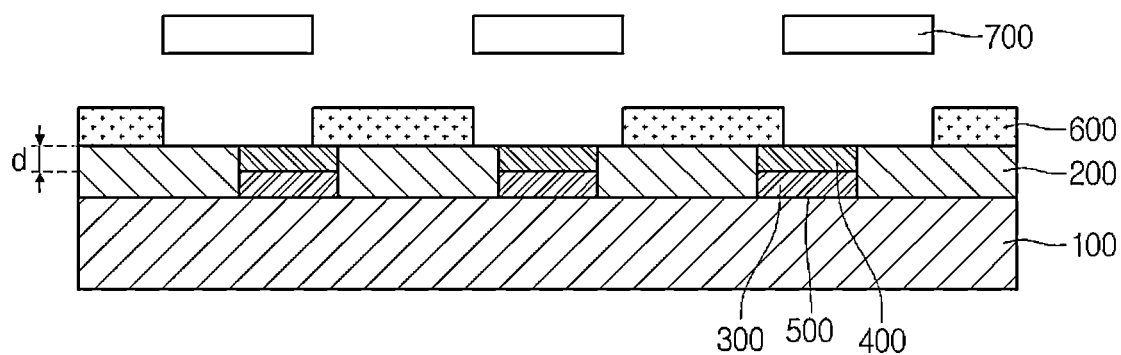
FIGS. 2 to 4 are sectional views showing a touch window according to the first embodiment.
Figure 3:
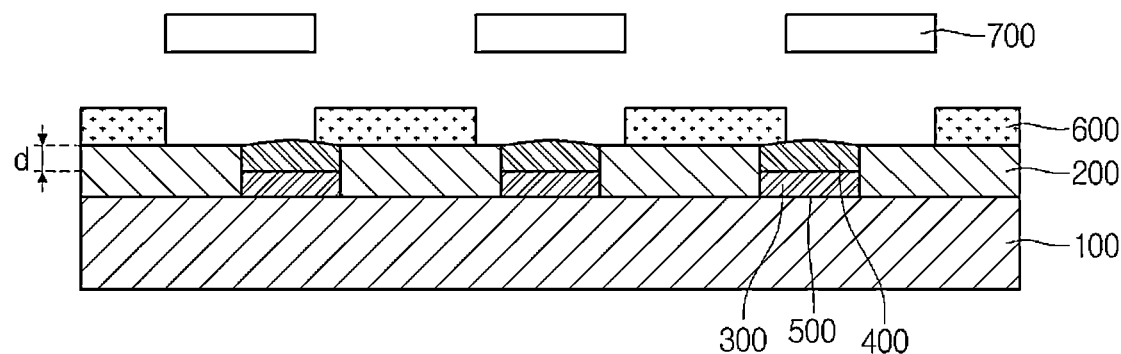
Figure 4:
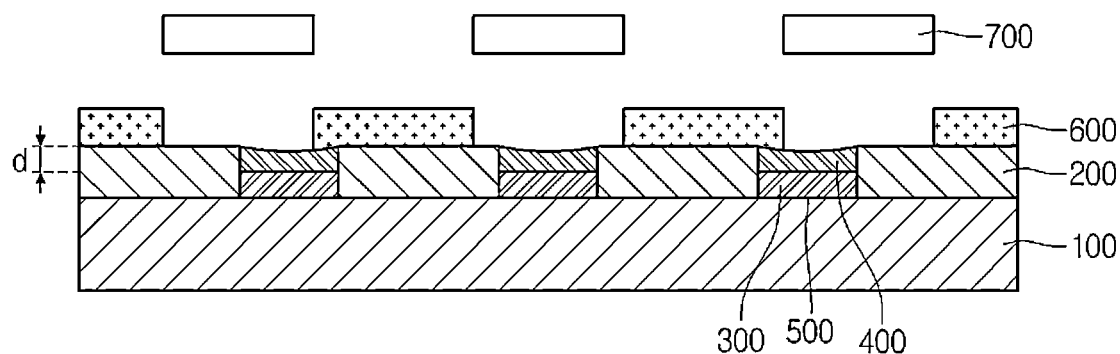

FIGS. 2 to 4 are sectional views showing a touch window according to the first embodiment. In detail, FIGS. 2 to 4 are a longitudinal sectional view of a portion in which an instruction icon pattern part is formed.

Referring to FIGS. 2 to 4, the touch window includes a cover window 100, an instruction icon pattern part 500, a first print layer 200 formed on the cover window 100, a second print layer 300 disposed in the instruction icon pattern part 500, and a reinforcement material 400 disposed on the second print layer 300.

The cover window 100 may include one of strengthened glass, half-strengthened glass, sodalime glass and strengthened plastic.

The first print layer 200 is disposed on the cover window 100.

The first print layer 200 may be formed by coating black ink on the cover window 100.

The first print layer 200 may be disposed on the cover window 100 and the instruction icon pattern part 500 may be formed on the cover window 100.

The first print layer 200 may have a thickness in the range of about 7 µm to about 10 µm.

If the thickness of the first print layer 200 is less than 7 µm, it may be difficult to form the instruction icon pattern and the visibility may be deteriorated. If the thickness of the first print layer 200 exceeds 10 µm, step difference may be excessively formed so that process efficiency may be deteriorated.

That is, the cover window 100 may include a portion where the first print layer 200 is disposed and a portion where the first print layer 200 is not disposed. The instruction icon pattern 500 may be the portion where the first print layer 200 is not formed. That is, the first print layer 200 is formed on the cover window 100 except for an area where the instruction icon is to be formed.

The second print layer 300 may be disposed in the instruction icon pattern part 500. In detail, the second print layer 300 may be formed in the area on the cover window 100, in which the first print layer 200 is not formed.

The second print layer 300 may be formed by coating white ink.

The second print layer 300, which is filled in the instruction icon pattern part 500, may have a thickness in the range of about 3 μm to about 5 μm.

When the thickness of the second print layer 300 is less than 3 μm, the instruction icon pattern part may not be sufficiently printed. When the thickness of the second print layer 300 exceeds 5 μm, step difference may be excessively formed so that process efficiency may be deteriorated.

Thus, the first print layer 200 and the second print layer 300 filled in the instruction icon pattern part 500 may form a step difference having a predetermined height. Since the thickness of the first print layer 200 formed on the cover window 100 is thicker than that of the second print layer 300, the step difference part may be formed by a height difference d between the first print layer 200 and the second print layer 300.

The reinforcement material 400 may be filled in the step difference part. In detail, the step difference part may be filled with the reinforcement material 400 and may be disposed on the second print layer 300 disposed in the instruction icon pattern part 500.

The whole or a portion of the step difference part may be filled with the reinforcement material 400. Further, as shown in FIGS. 3 and 4, an outer surface of the reinforcement material 400 filled in the step difference part may include at least one of a convex shape, a concave shape and a flat shape.

Thus, the reinforcement material 400 may be filled in the step difference part so that the height difference between the first and second print layers 20 and 30 may be offset.

According to the related art, after the first and second print layers are disposed on the cover window, a sensing electrode is directly disposed on the first print layer. However, when a little impact is applied to the instruction icon pattern or a pressure of pushing the instruction icon is generated due to a step difference formed in the instruction icon pattern, the sensing electrode may be subject to disconnection or fine crack.

Thus, in the touch window according to the embodiment, the instruction icon pattern may be filled with the reinforcement material 400, so that the height difference between the first and second print layers may be offset, thereby solving the above-described problems.

The reinforcement material 500 may include an insulation material. In detail, the reinforcement material 500 may include a transparent insulation material. For example, the reinforcement material 500 may include at least one of UV curable resin, photo-curable resin and thermosetting resin.

The sensing electrode 600 may be formed on the first or second print layer 200 or 300. The sensing electrode 600 may include at least one selected from the group consisting of indium tin oxide, indium zinc oxide, copper oxide, carbon nano tube, CNT and Ag nano wire.

After the above materials are coated on the first or second print layer 200 or 300, the sensing electrode 600 may be formed by patterning the materials. For instance, the sensing electrode 600 may include a first sensing electrode including a first electrode pattern aligned in the longitudinal direction and a second electrode including a second electrode pattern aligned in the transverse direction The sensing electrode 600 is densely formed on a top surface of the cover window 100 and is connected to a portion of the instruction icon pattern part of the cover window 100.

In addition, the touch window according to the embodiment may further include a wiring electrode (not shown) electrically connected to the sensing electrode 600. When a pressure is applied to the instruction icon pattern part 500, the wiring electrode may serve as a wiring pattern of transferring a functional instruction related to the instruction icon pattern part 500.

The touch window according to the embodiment may further include a light source 700 disposed on the sensing electrode 600. For example, the light source 700 may include a light emitting diode (LED). When a touch pressure is applied to the instruction icon pattern part 500, the light source 700 performs a blinking function for feedbacking the touch. The light source 700 may radiate light toward the instruction icon pattern part 500 which performs the blinking function by receiving the light.

Hereinafter, a touch window according to the second embodiment will be described with reference to FIG. 5.

Figure 5:
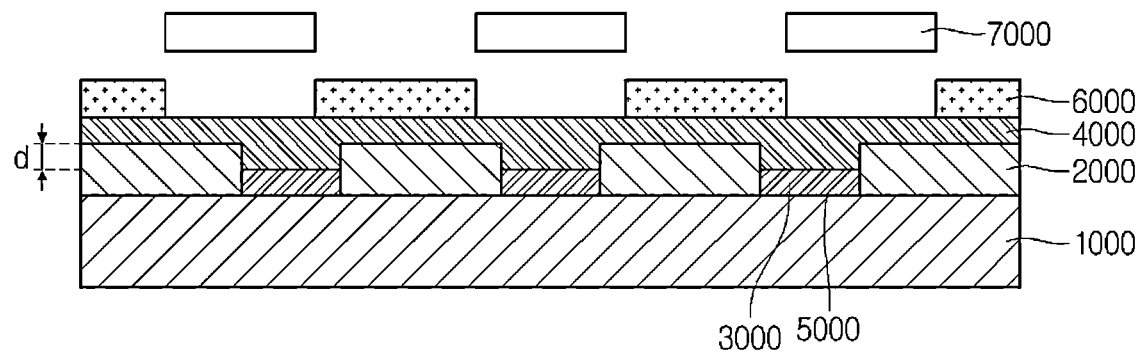
FIG. 5 is a sectional view showing a touch window according to the second embodiment.

FIG. 5 is a sectional view showing the touch window according to the second embodiment. FIG. 5 is a longitudinal sectional view of a part of the touch window in which an instrument icon pattern part is formed.

In the following description about the touch window according to the second embodiment, the parts similar or identical to those of the first embodiment will be omitted in order to avoid redundancy. That is, the description about the touch window according to the second embodiment cooperates essentially with the description about the touch window according to the first embodiment.

Referring to FIG. 5, the touch window 1000 according to the second embodiment includes a cover window 1000, an instruction icon pattern part 5000, a first print layer 2000 formed on the cover window 1000, a second print layer 3000 disposed in the instruction icon pattern part 5000, and a reinforcement layer 4000 disposed on the first print layer 2000.

Referring to FIG. 5, the touch window according to the second embodiment includes the reinforcement layer 4000 formed on the first print layer 2000. In detail, the reinforcement layer 4000 is formed on the first print layer 2000 while filling a height difference d, that is, a step difference caused by a thickness difference between the first and second print layers 2000 and 3000.

Thus, the reinforcement layer 4000 can make direct contact with the first and second print layers 2000 and 3000.

The reinforcement layer 4000 may be disposed on the first print layer 2000 to fill the step difference part by coating the reinforcement material on the first print layer 2000 and laminating the reinforcement material.

Therefore, since the reinforcement layer 500 is provided while filling the step difference part, the height difference between the thicknesses of the first and second print layers 2000 and 3000 may be offset.

According to the touch windows of the first and second embodiments, the step difference part due to the difference between the thicknesses of the first and second print layers is filled with the reinforcement material or layer, so that the height difference may be offset.

Figure 6:
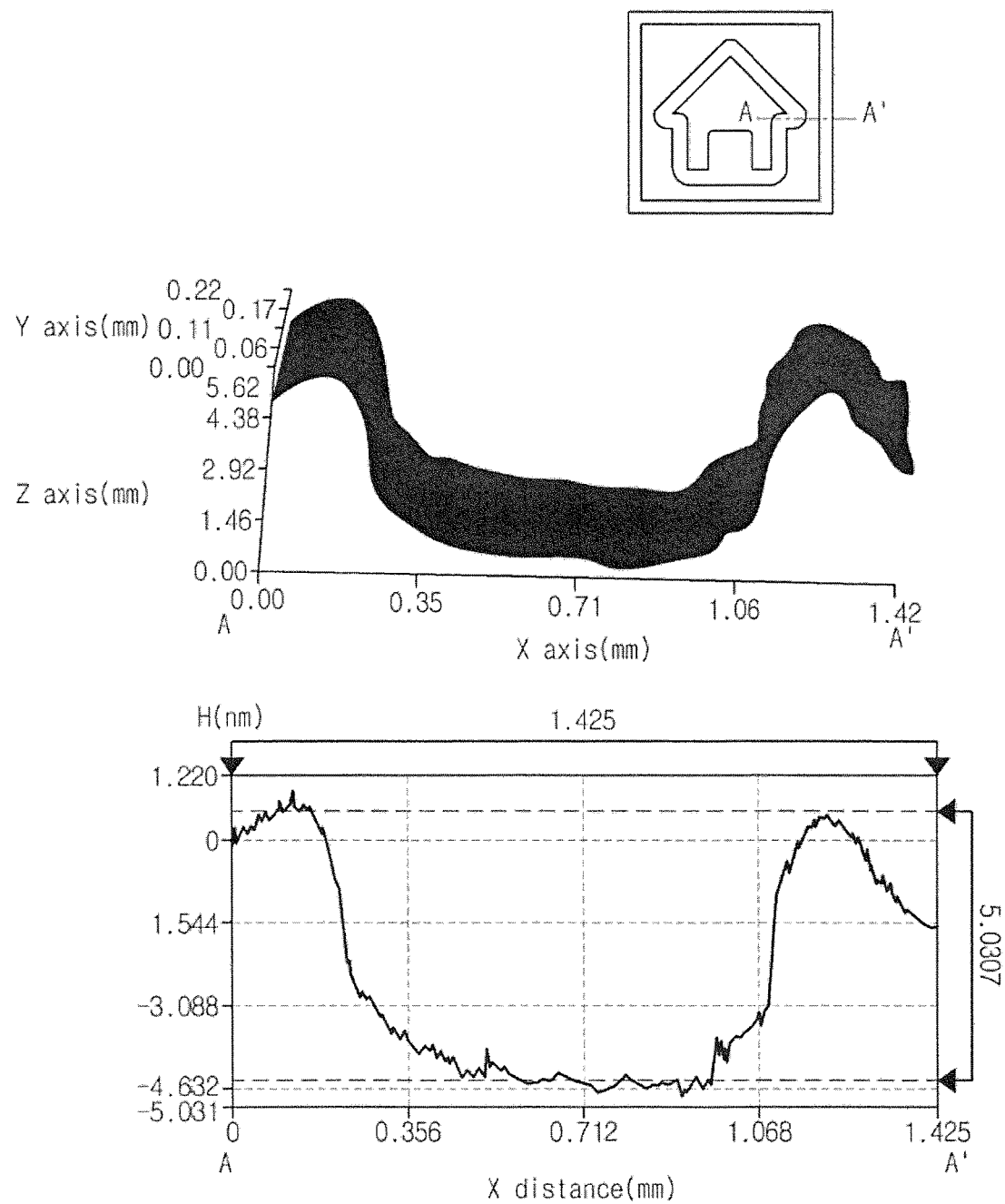
FIGS. 6 and 7 are graphs showing a measured gradient of an instruction icon pattern part according to the related art and an embodiment.
Figure 7:
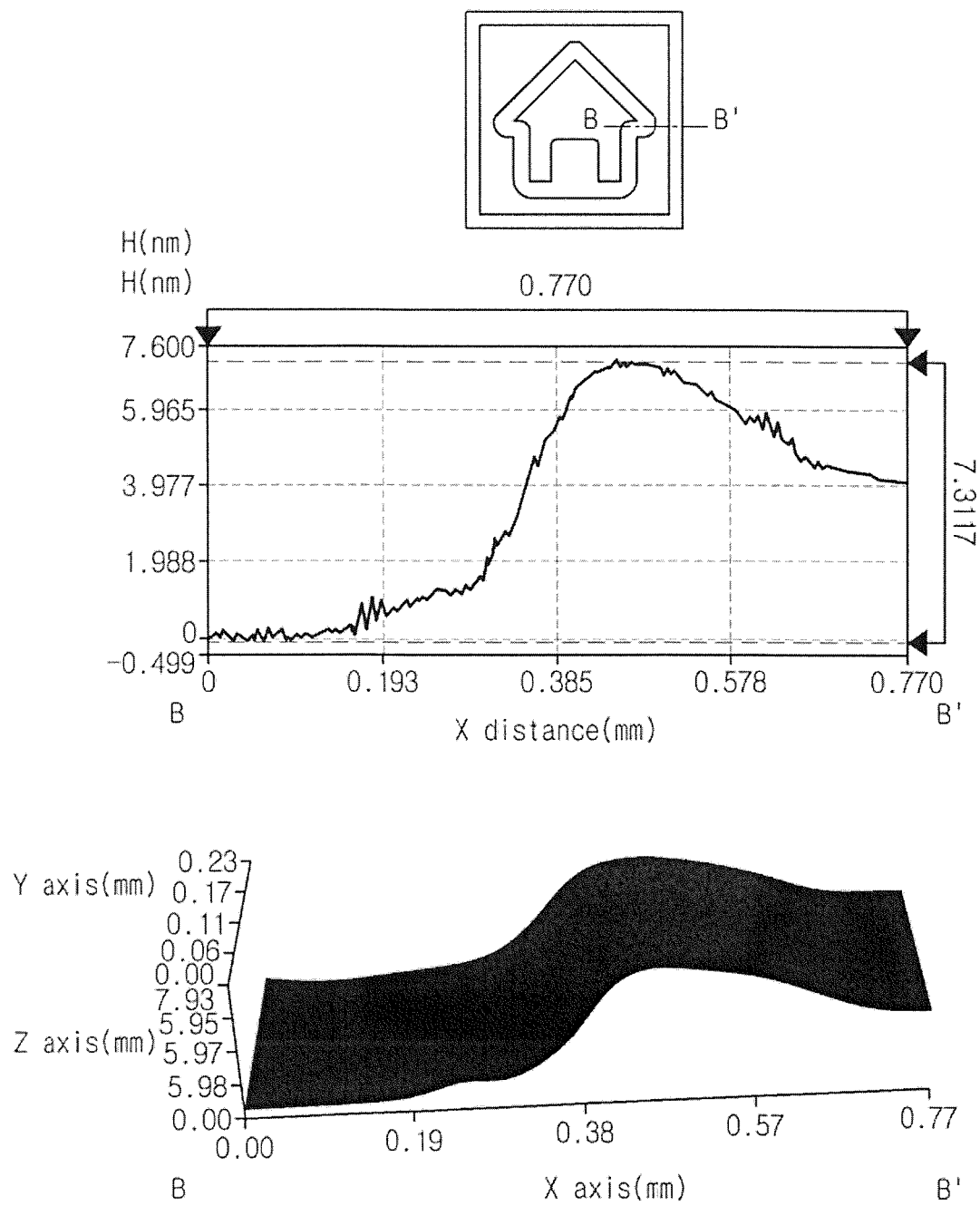

FIG. 6 is a graph showing a measured gradient of an instruction icon pattern part according to the related art. FIG. 7 is a graph showing a measured gradient of an instruction icon pattern part according to the embodiment.

Referring to FIGS. 6 and 7, a gradient according to the related art 410, in which the instruction icon pattern part is formed without the reinforcement material or layer, is greater than the gradient of a case in which the reinforcement material or reinforcement layer is formed between the instruction icon pattern part and the sensing electrode.

That is, although the step difference part is formed due to the thickness difference between the first and second print layers since the reinforcement layer or material is not formed in the related art as shown in FIG. 6, according to the touch window of the embodiment, the step difference part is filled with the reinforcement layer or reinforcement material, so that the height difference can be offset as shown in FIG. 7.

Therefore, according to the touch window of the embodiment, the height difference, that is, the step difference of the instrument icon pattern part is reduced, so that the sensing electrode can be inhibited from being subject to the disconnection and fine crack on the instruction icon pattern part.

The touch window according to the disclosure may be attached to various display devices. In other words, the display device may include an organic light emitting device or a plasma display panel other than a liquid crystal display. In this case, to inhibit a touch sensing panel from erroneously operating as the noise component generated due to the driving of the display device is transferred to a touch sensor module, that is, a touch screen panel (TSP), a shield layer may be selectively provided between the touch sensing panel and the display device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A touch window comprising:
   a cover window;
   a first print layer disposed on the cover window to form an instruction icon pattern part;
   a second print layer in the instruction icon pattern part;
   a reinforcement material on the second print layer; and
   a sensing electrode on the instruction icon pattern part;
   wherein the first print layer is formed with a plurality of holes,
   wherein the holes correspond to the instruction icon pattern part,
   wherein the second print layer is disposed only in the holes of the first print layer,
   wherein a top surface of the first print layer lies in a same plane as a top surface of the reinforcement material,
   wherein the first print layer and the second print layer both comprise ink material,
   wherein a step difference part is formed between the first and second print layers,
   wherein the reinforcement material makes direct contact with the second print layer,
   wherein the sensing electrode is in direct physical contact with the reinforcement material,
   wherein the first print layer and the second print layer do not overlap each other in a first direction perpendicular to a top surface of the cover window,
   wherein the first print layer and the reinforcement material do not overlap each other in the first direction,
   wherein the sensing electrode is partially overlapped with the instruction icon pattern part in the first direction,
   wherein the first print layer has a thickness in a range of about 7 μm to about 10 μm, and
   wherein the second print layer has a thickness in a range of about 3 μm to about 5 μm.

2. The touch window of claim 1, wherein the reinforcement material includes at least one selected from the group consisting of: a convex surface; a concave surface; and a flat surface.

3. The touch window of claim 1, wherein the step difference part is fully filled with the reinforcement material.

4. The touch window of claim 1, wherein the first print layer includes a black ink, and
   the second print layer includes a white ink.

5. The touch window of claim 1, wherein the reinforcement material includes a transparent insulation material, and
   the transparent insulation material includes at least one selected from the group consisting of: UV-curable resin; photo-curable resin; and thermosetting resin.

* * * * *